(12) United States Patent
Son

(10) Patent No.: US 12,469,427 B2
(45) Date of Patent: Nov. 11, 2025

(54) OLED DISPLAY SYSTEM HAVING VARIABLE BEAM ANGLES ACCORDING TO SPEED AND CONTROL METHOD THEREOF

(71) Applicant: HYUNDAI MOBIS CO., LTD., Seoul (KR)

(72) Inventor: Ho Won Son, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 18/643,062

(22) Filed: Apr. 23, 2024

(65) Prior Publication Data

US 2025/0037636 A1 Jan. 30, 2025

(30) Foreign Application Priority Data

Jul. 26, 2023 (KR) .................. 10-2023-0097131

(51) Int. Cl.
*G09G 3/3208* (2016.01)
*G09G 3/20* (2006.01)
(Continued)

(52) U.S. Cl.
CPC ......... *G09G 3/2092* (2013.01); *G09G 3/3208* (2013.01); *H10K 50/131* (2023.02);
(Continued)

(58) Field of Classification Search
CPC ............... G09G 3/2092; G09G 3/3208; G09G 2320/028; G09G 2320/0666; G09G 2320/0673; G09G 2380/10; G09G 2300/023; G09G 2320/068; G09G 2358/00; G09G 5/14; G09G 3/3225; G09G 2310/0243; G09G 2310/0264;
(Continued)

(56) References Cited

U.S. PATENT DOCUMENTS

2015/0054815 A1 2/2015 Toyoda et al.
2016/0349868 A1* 12/2016 Kim ..................... G09G 3/3406
(Continued)

FOREIGN PATENT DOCUMENTS

KR 1020120067234 A * 6/2012 ............. B06K 35/00

OTHER PUBLICATIONS

Extended European Search Report issued on Oct. 25, 2024 in European Patent Application No. 24172038.2.

*Primary Examiner* — Adam J Snyder
(74) *Attorney, Agent, or Firm* — Morgan, Lewis & Bockius LLP

(57) ABSTRACT

Provided are an organic light emitting element (OLED) display system and a control method thereof. In more detail, the system disposed in a moving object includes: an OLED display including a first organic light-emitting layer and a second organic light-emitting layer; and a control unit controlling on/off of at least one of the first organic light-emitting layer and the second organic light-emitting layer, wherein the second organic light-emitting layer has a larger beam angle than the first organic light-emitting layer, and the control unit controls the on/off of the at least one of the first organic light-emitting layer and the second organic light-emitting layer based on a speed of the moving object.

14 Claims, 5 Drawing Sheets

(51) Int. Cl.
*H10K 50/13* (2023.01)
*B60K 35/22* (2024.01)
*B60K 35/234* (2024.01)
*B60K 37/00* (2006.01)
*B60R 11/02* (2006.01)
*G09F 9/33* (2006.01)
*G09G 3/3225* (2016.01)
*G09G 5/14* (2006.01)
*H10K 59/30* (2023.01)

(52) U.S. Cl.
CPC ............ *B60K 35/22* (2024.01); *B60K 35/234* (2024.01); *B60K 37/00* (2013.01); *B60R 11/0229* (2013.01); *G09F 9/335* (2021.05); *G09G 3/3225* (2013.01); *G09G 5/14* (2013.01); *G09G 2300/023* (2013.01); *G09G 2310/0243* (2013.01); *G09G 2310/0264* (2013.01); *G09G 2320/0233* (2013.01); *G09G 2320/028* (2013.01); *G09G 2320/0626* (2013.01); *G09G 2320/0666* (2013.01); *G09G 2320/0673* (2013.01); *G09G 2320/068* (2013.01); *G09G 2358/00* (2013.01); *G09G 2380/10* (2013.01); *H10K 59/30* (2023.02)

(58) Field of Classification Search
CPC ... G09G 2320/0233; G09G 2320/0626; H10K 50/131; H10K 59/30; G09F 9/335; B60K 35/22; B60K 35/234; B60K 37/00; B60R 11/0229

See application file for complete search history.

(56) References Cited

U.S. PATENT DOCUMENTS

| | | |
|---|---|---|
| 2021/0063783 A1 | 3/2021 | Byoun et al. |
| 2021/0223583 A1* | 7/2021 | Heber ...................... G09G 3/32 |
| 2023/0150439 A1 | 5/2023 | Chen et al. |
| 2024/0212576 A1* | 6/2024 | Lee ...................... G09G 3/3233 |

* cited by examiner

[FIG. 1]
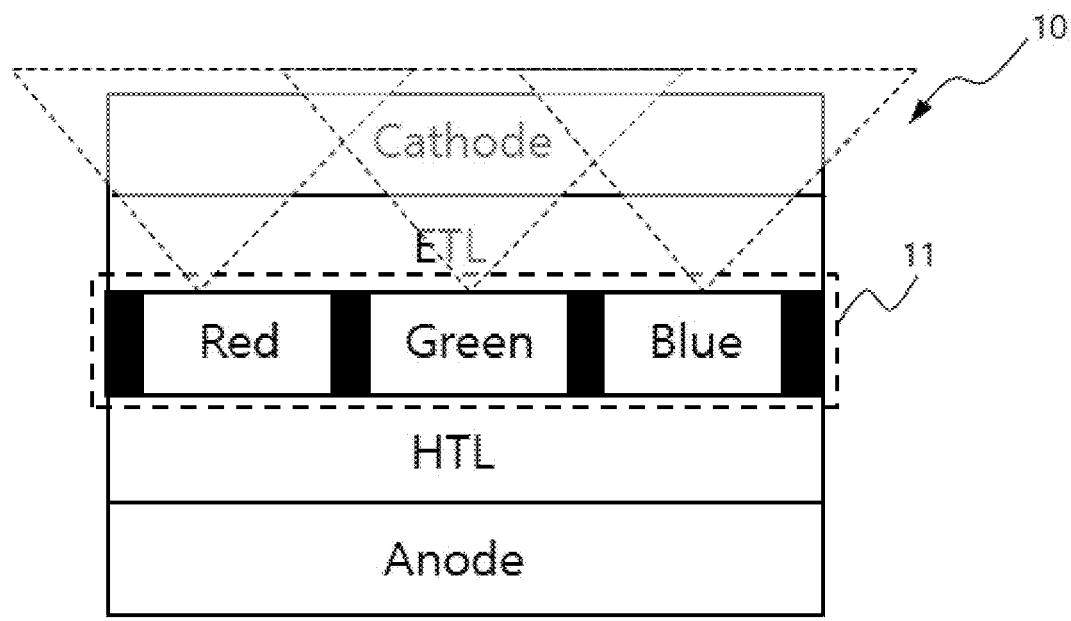

[FIG. 2]
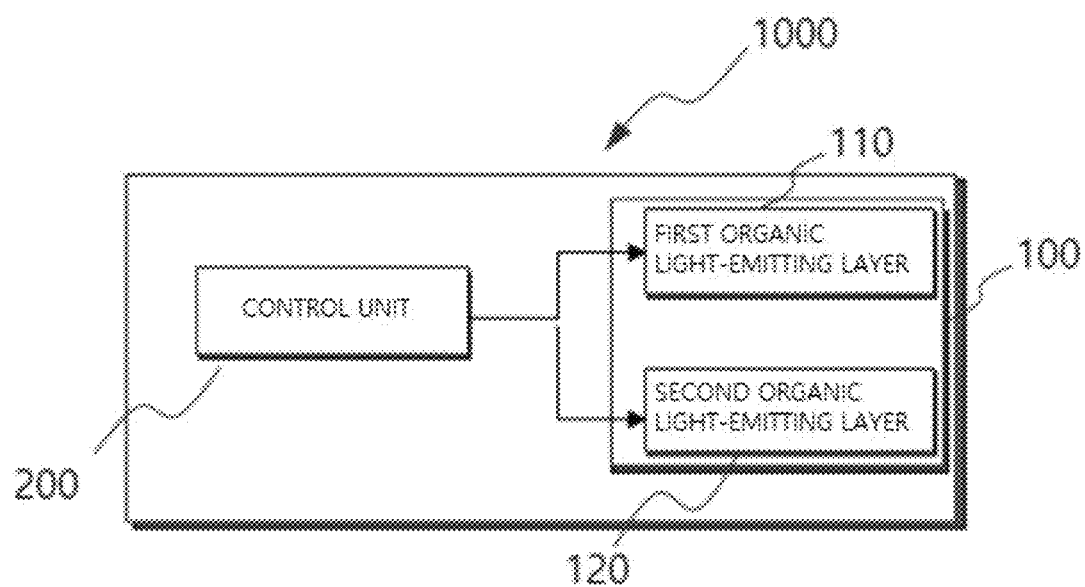

[FIG. 3A]
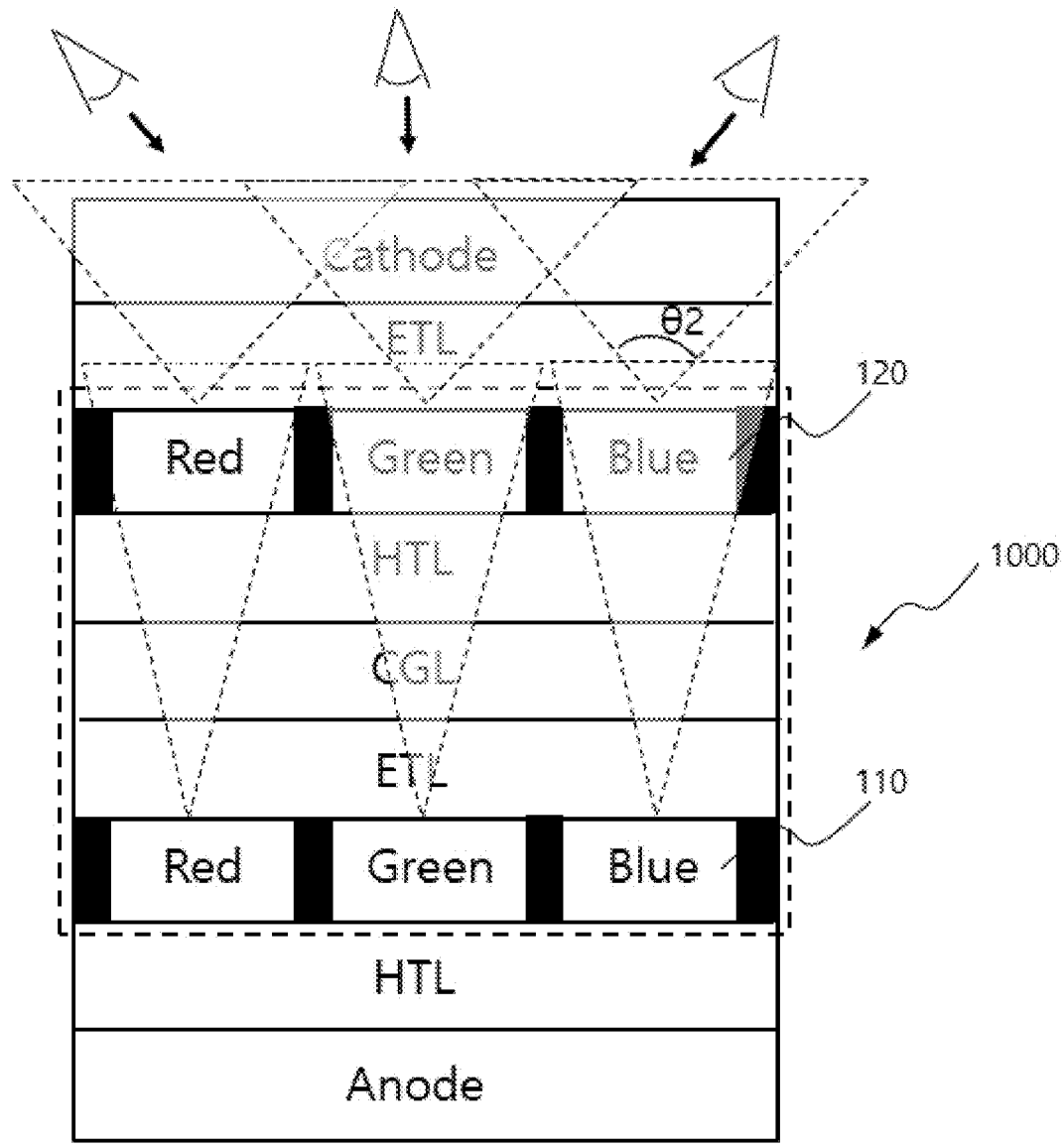

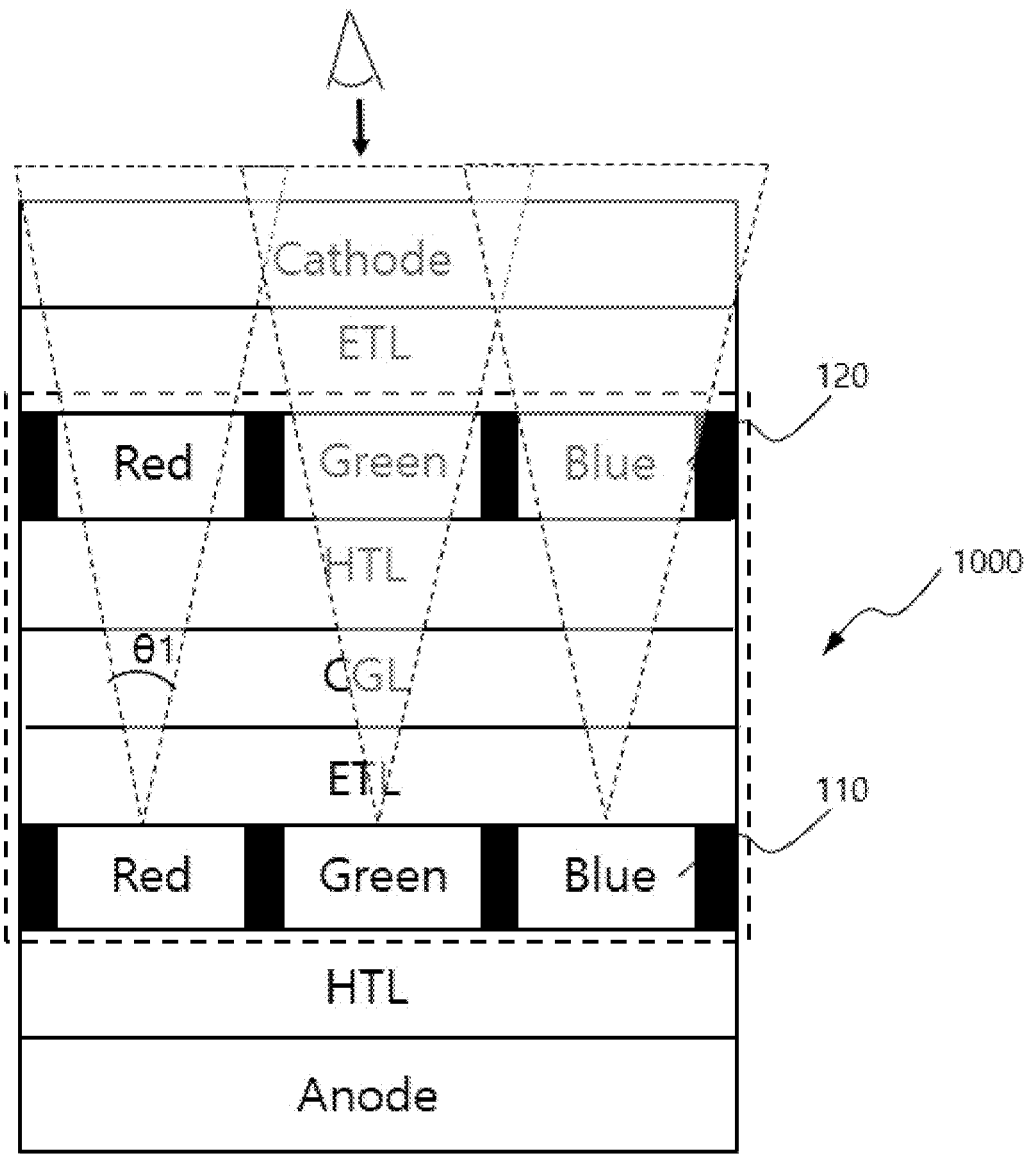
[FIG. 3B]

[FIG. 4]
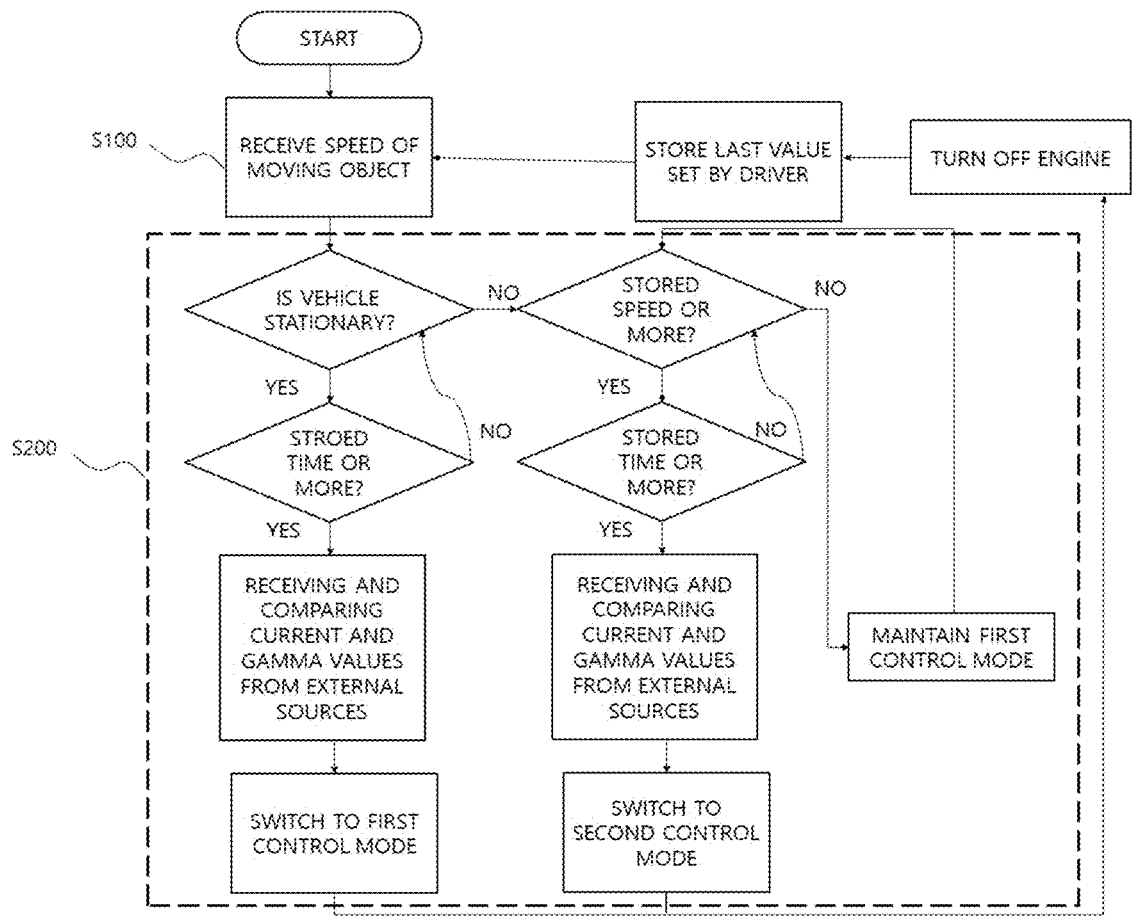

OLED DISPLAY SYSTEM HAVING VARIABLE BEAM ANGLES ACCORDING TO SPEED AND CONTROL METHOD THEREOF

CROSS-REFERENCE TO RELATED APPLICATIONS

This application claims priority under 35 U.S.C. § 119 to Korean Patent Application No. 10-2023-0097131, filed on Jul. 26, 2023, in the Korean Intellectual Property Office, the disclosure of which is incorporated herein by reference in its entirety.

TECHNICAL FIELD

The following disclosure relates to an organic light emitting element (OLED) display system and a control method thereof.

BACKGROUND

A display system of a vehicle may be mainly installed on the instrument panel, central console, entertainment system, or the like of the vehicle, and visually deliver information to a driver and a passenger in the vehicle. For example, a driving information display system may provide driving-related information such as the speed, a revolution per minute (RPM), a fuel level, a mileage, or the like of the vehicle. This display may be mainly mounted on the instrument panel, may be configured as a digital display panel, or may be provided as a combined analog and digital display. In recent years, an electronic instrument panel has been used more, and a virtual or customized display shape may be selected in some cases. In addition, the display system on the central console may be mainly connected to an information entertainment system of the vehicle. The display may provide a navigation system, a multimedia playback, a communication function, or the like. A lot of vehicles may use a touch screen interface to allow a user to easily access and control the functions. In addition, in some vehicles, a voice recognition function may allow the driver to perform a task such as entering a destination or connecting a mobile phone. In addition, as an era of an electric vehicle and autonomous driving begins, the display system may have an increasingly larger size and a higher resolution, and is continuously evolving to provide more convenient and useful information to the driver and the passenger.

In addition to the functions described above, a co-driver display which is also a type of the display may allow the passenger in addition to the driver to check and interact with information. This display may be mainly mounted on the central console or in front of a co-driver seat, and may provide a variety of functions such as entertainment, navigation, communication, and the like, these functions being recently spotlighted in a market.

Meanwhile, as the display becomes larger and more diverse, the display within a driver's view may also become wider and more numerous. In addition, image noise may occur due to a co-driver seat display image, which may disturb the driver's driving while driving. Accordingly, it may be important to reduce a frequency of the image noise occurring in the driver's view during the driving. Recently, a major original equipment (OE) may have an increasing requirement for a display having viewing angle control technology that may limit viewing of a multimedia image to a driver direction of a front passenger display. In addition, in addition to the driver seat direction, a side-window reflection may also be restricted because such a reflection may disturb the vehicle driving.

RELATED ART DOCUMENT

Patent Document

U.S. Patent Publication No. 2023-0150439 ("ELECTRONIC DEVICE AND VEHICLE", published on May 18, 2023)

SUMMARY

An embodiment of the present disclosure is directed to providing an organic light emitting element (OLED) display system which may not disturb a driver's view, and a control method thereof.

In one general aspect, provided is an organic light emitting element (OLED) display system disposed in a moving object, the system including: an OLED display including a first organic light-emitting layer and a second organic light-emitting layer; and a control unit controlling on/off of at least one of the first organic light-emitting layer and the second organic light-emitting layer, wherein the second organic light-emitting layer has a larger beam angle than the first organic light-emitting layer, and the control unit controls the on/off of the at least one of the first organic light-emitting layer and the second organic light-emitting layer based on a speed of the moving object.

The control unit controls the first organic light-emitting layer and the second organic light-emitting layer in a first control mode, in which both the first organic light-emitting layer and the second organic light-emitting layer are turned on, when the speed of the moving object is zero and maintained at the same speed for a predetermined time.

The control unit maintains the first control mode when the speed of the moving object is increased in the first control mode to be a predetermined reference speed or less, and controls the first organic light-emitting layer and the second organic light-emitting layer in a second control mode, in which the first organic light-emitting layer is turned on and the second organic light-emitting layer is turned off, when the speed of the moving object is increased in the first control mode, and maintained to be greater than the reference speed for the predetermined time.

The control unit increases an amount of a current applied to the first organic light-emitting layer when switching the first control mode to the second control mode.

The control unit applies pre-stored gamma and color coordinate values when switching the first control mode to the second control mode.

In another general aspect, provided is a control method of an organic light emitting element (OLED) display system disposed in a moving object including an OLED display and a control unit, the method including: (a) receiving, by the control unit, a speed of the moving object; and (b) controlling, by the control unit, on/off of at least one of a first organic light-emitting layer and a second organic light-emitting layer based on the speed of the moving object.

In the operation (b), the first organic light-emitting layer and the second organic light-emitting layer are controlled in a first control mode, in which both the first organic light-emitting layer and the second organic light-emitting layer are turned on, when the speed of the moving object is zero and maintained at the same speed for a predetermined time.

In the operation (b), the first control mode is maintained when the speed of the moving object is increased in the first control mode to be a predetermined reference speed or less, and the first organic light-emitting layer and the second organic light-emitting layer are controlled in a second control mode, in which the first organic light-emitting layer is turned on and the second organic light-emitting layer is turned off, when the speed of the moving object is increased in the first control mode, and maintained to be greater than the reference speed for the predetermined time.

In the operation (b), an amount of a current applied to the first organic light-emitting layer is increased when the first control mode is switched to the second control mode.

In the operation (b), pre-stored gamma and color coordinate values are applied when the first control mode is switched to the second control mode.

BRIEF DESCRIPTION OF THE DRAWINGS

FIG. 1 is a schematic view showing a structure of a conventional organic light emitting element (OLED) panel.

FIG. 2 is a schematic view showing an OLED display system according to an embodiment of the present disclosure.

FIGS. 3A and 3B are schematic views each showing an OLED structure according to an embodiment of the present disclosure.

FIG. 4 is a flowchart showing a control method of an OLED display system according to an embodiment of the present disclosure.

DETAILED DESCRIPTION OF EMBODIMENTS

In order to describe the present disclosure, operational advantages of the present disclosure, and objects accomplished by embodiments of the present disclosure, the embodiments of the present disclosure are hereinafter exemplified and described with reference to the accompanying drawings.

First, terms used in this application are used only to describe specific embodiments rather than limiting the present disclosure, and a term of a singular number may include its plural number unless explicitly indicated otherwise in the context. It is to be understood that a term "include", "formed of", or the like used in this application specifies the existence of features, numerals, steps, operations, components, parts, or combinations thereof, which is mentioned in the specification, and does not preclude the existence or addition of one or more other features, numerals, steps, operations, components, parts or combinations thereof.

When it is decided that the detailed description of the known configuration or function related to the present disclosure may obscure the gist of the present disclosure, the detailed description thereof will be omitted.

FIG. 1 is a schematic view showing a structure of a conventional organic light emitting element (OLED) panel.

As shown in FIG. 1, the structure of the conventional OLED panel may include a single organic light-emitting layer 11.

In this case, the conventional OLED panel including the single organic light-emitting layer may be required to always be controlled in a shared mode.

That is, a driver and a passenger in a co-driver seat may have no choice but to share one image together.

FIG. 2 is a schematic view showing an OLED display system according to an embodiment of the present disclosure; and FIGS. 3A and 3B are schematic views each showing an OLED structure according to an embodiment of the present disclosure.

As shown in FIG. 2, an OLED display system 1000 disposed in a moving object according to the present disclosure may include an OLED display 100 and a control unit 200. The control unit 200 (or controller) may be implemented with a circuit, or alternatively, by a processor together with a non-transitory computer-readable storage medium storing commands, when executed by the processor, causing the processor to perform various operations described with reference to the control unit 200.

The OLED display 100 may include an anode A and a cathode C, and include a first organic light-emitting layer 110 and a second organic light-emitting layer 120, provided between the anode A and the cathode C. Here, the organic light-emitting layer may refer to a layer including a luminescent material emitting light in response to a current being applied thereto.

In addition, the second organic light-emitting layer 120 may be stacked on the first organic light-emitting layer 110, and may be connected in parallel with each other.

The control unit 200 may determine a control mode based on a received speed of the moving object, and control on/off of each of the first organic light-emitting layer 110 and the second organic light-emitting layer 120 based on the determined control mode.

In detail, based on the received speed of the moving object from a speed sensor of the moving object, the control unit 200 may perform the control in a first control mode in which both the first organic light-emitting layer 110 and the second organic light-emitting layer 120 are turned on.

The driver and the passenger may share an image together in the first control mode because both the first organic light-emitting layer 110 and the second organic light-emitting layer 120 are turned on.

In addition, based on the received speed of the moving object, the control unit 200 may perform the control in a second control mode in which the first organic light-emitting layer 110 is turned on and the second organic light-emitting layer is turned off.

In the second control mode, only the first organic light-emitting layer 110 may be turned on. Therefore, light emitted from the first organic light-emitting layer 110 may provide the image with a viewing angle limited by the second organic light-emitting layer 120.

In more detail, as shown in FIGS. 3A and 3B, the OLED display 100 according to the present disclosure may include a first substrate (not shown) which is a substrate on which a plurality of pixels are arranged. The plurality of pixels may be gathered to produce white light, and for example, red, green, and blue pixels may be gathered to form a group. In addition, the OLED display 100 may include a second substrate (not shown) disposed on its surface facing the first substrate, and the second substrate (not shown) may include a plurality of color layers corresponding to the plurality of pixels described above, and may include a black matrix for distinguishing the respective pixels from each other. It is possible to prevent interference between colors and distinguish the respective colors from each other by using the black matrix of the second substrate.

Therefore, the image with the viewing angle limited by the black matrix of the second organic light-emitting layer 120 may be provided when the control unit 200 turns on only the first organic light-emitting layer 110 in the second control mode.

In detail, FIG. 3A shows the first control mode, and FIG. 3B shows the second control mode. Here, when assuming that a beam angle by the first organic light-emitting layer 110 is θ1, and a beam angle by the second organic light-emitting layer 120 is θ2, the image with the viewing angle limited by the black matrix of the second organic light-emitting layer 120 may thus be provided because θ1 is greater than θ2.

Meanwhile, the control unit 200 may control the first organic light-emitting layer 110 and the second organic light-emitting layer 120 in the first control mode or the second control mode based on the speed of the moving object.

In detail, the control unit 200 may perform the control in the first control mode when the received speed of the moving object is zero and maintained at the same speed for a predetermined time.

In addition, the control unit 200 may control the control mode to be maintained at the first control mode when the speed of the moving object is increased in the first control mode to be a predetermined reference speed or less. On the other hand, the control unit 200 may control the control mode to be switched to the second control mode when the speed of the moving object is increased in the first control mode, and maintained to be greater than the reference speed for the predetermined time.

Here, the system 1000 may have lower luminance and changed color coordinates when the mode is changed by the control unit 200, especially when the first control mode is changed to the second mode. Accordingly, the control unit 200 may increase the current applied to the first organic light-emitting layer 110 to produce brighter luminance. In addition, the control unit 200 may compensate for a change in the color coordinates by applying pre-stored gamma and color coordinate values.

Accordingly, the first organic light-emitting layer 110 and the second organic light-emitting layer 120 may be operated in the first control mode when the moving object stops or has a speed not changed for the predetermined time. Therefore, the driver and the passenger may share the image together, thus ensuring driving safety.

In addition, the first organic light-emitting layer 110 and the second organic light-emitting layer 120 may be operated in the second control mode when the moving object has a speed increased to the predetermined reference speed or more, thereby preventing any disturbance to the driver while driving.

FIG. 4 is a flowchart showing a control method of an OLED display system according to an embodiment of the present disclosure.

In the control method of the OLED display system which is disposed in a moving object including an OLED display 100 and a control unit 200 according to the present disclosure, the control unit 200 may receive a speed of the moving object in an operation S100, and determine a control mode based on the received speed of the moving object, and control on/off of each of a first organic light-emitting layer 110 and a second organic light-emitting layer 120 based on the determined control mode in an operation S200.

In detail, based on the speed of the moving object received in the operation S200, the control unit 200 may perform the control in a first control mode in which both the first organic light-emitting layer 110 and the second organic light-emitting layer 120 are turned on.

A driver and a passenger may share an image together in the first control mode because both the first organic light-emitting layer 110 and the second organic light-emitting layer 120 are turned on.

In addition, based on the received speed of the moving object, the control unit 200 may perform the control in a second control mode in which the first organic light-emitting layer 110 is in turned on and the second organic light-emitting layer is turned off.

In the second control mode, only the first organic light-emitting layer 110 may be turned on. Therefore, light emitted from the first organic light-emitting layer 110 may provide the image with a viewing angle limited by the second organic light-emitting layer 120.

In detail, the control unit 200 may perform the control in the first control mode when the received speed of the moving object is zero and is maintained at the same speed for a predetermined time.

In addition, the control unit 200 may control the control mode to be maintained at the first control mode when the speed of the moving object is increased in the first control mode, and belongs to a predetermined reference speed or less. On the other hand, the control unit 200 may control the control mode to be switched to the second control mode when the speed of the moving object is increased in the first control mode, and maintained to be greater than the reference speed for the predetermined time.

Here, the system 1000 may have lower luminance and changed color coordinates when the mode is changed by the control unit 200, especially when the first control mode is changed to the second mode. Accordingly, the control unit 200 may increase a current applied to the first organic light-emitting layer 110 to produce brighter luminance. In addition, the control unit 200 may compensate for a change in the color coordinates by applying pre-stored gamma and color coordinate values.

As set forth above, the OLED display system and the control method thereof according to the various embodiments of the present disclosure as described above may change the mode not to disturb the driver's view, thereby promoting the safety of the driver, the passenger, or a pedestrian.

Further, the present disclosure may satisfy various user conditions by allowing the driver to quantitatively control the display exposure amount.

Furthermore, the present disclosure may use such a physically simple structure, thereby securing higher reliability.

Although the embodiments of the present disclosure are described as above, the embodiments disclosed in the present disclosure are provided not to limit the spirit of the present disclosure but to fully describe the present disclosure. Therefore, the spirit of the present disclosure may include not only each disclosed embodiment but also a combination of the disclosed embodiments. Further, the scope of the present disclosure is not limited to these embodiments. In addition, it is apparent to those skilled in the art to which the present disclosure pertains that various variations and modifications could be made without departing from the spirit and scope of the appended claims, and all such appropriate variations and modifications should be considered as falling within the scope of the present disclosure as equivalents.

What is claimed is:

1. An organic light emitting element (OLED) display system disposed in an object, the system comprising:
    an OLED display including a first organic light-emitting layer and a second organic light-emitting layer, the first organic light-emitting layer configured to emit light to an exterior of the OLED display system through the second organic light-emitting layer; and a controller controlling on/off of at least one of the first organic light-emitting layer and the second organic light-emitting layer based on a speed of the object received from a speed sensor of the object,
wherein the second organic light-emitting layer has a larger beam angle than the first organic light-emitting layer, and
the controller is configured to increase an amount of a current applied to the first organic light-emitting layer to increase bright luminance provided by the first organic light-emitting layer when the speed of the object increases from a predetermined reference speed.

2. The system of claim 1, wherein the controller controls the first organic light-emitting layer and the second organic light-emitting layer in a first control mode, in which both the first organic light-emitting layer and the second organic light-emitting layer are turned on, when the speed of the object is zero or maintained at the same speed for a predetermined time.

3. The system of claim 2, wherein the controller maintains the first control mode when the speed of the object is increased in the first control mode to be the predetermined reference speed or less.

4. The system of claim 3, wherein the controller controls the first organic light-emitting layer and the second organic light-emitting layer in a second control mode, in which the first organic light-emitting layer is turned on and the second organic light-emitting layer is turned off, when the speed of the object is increased in the first control mode, and maintained to be greater than the predetermined reference speed for the predetermined time.

5. The system of claim 3, wherein the controller increases the amount of the current applied to the first organic light-emitting layer when switching the first control mode to the second control mode.

6. The system of claim 3, wherein the controller applies pre-stored gamma and color coordinate values when switching the first control mode to the second control mode.

7. The system of claim 1, wherein the object includes a vehicle, and the OLED display is fixed with the vehicle such that the OLED display and the object have the same speed.

8. A control method of an organic light emitting element (OLED) display system disposed in an object including an OLED display and a controller, the method comprising:
(a) receiving, by the controller, a speed of the object from a speed sensor of the object; and
(b) controlling, by the controller, on/off of at least one of a first organic light-emitting layer and a second organic light-emitting layer of the OLED display based on the speed of the object, the first organic light-emitting layer configured to emit light to an exterior of the OLED display system through the second organic light-emitting layer,
wherein (b) comprises increasing, by the controller, an amount of a current applied to the first organic light-emitting layer to increase bright luminance provided by the first organic light-emitting layer when the speed of the object increases from a predetermined reference speed.

9. The method of claim 8, wherein in the operation (b), the first organic light-emitting layer and the second organic light-emitting layer are controlled in a first control mode, in which both the first organic light-emitting layer and the second organic light-emitting layer are turned on, when the speed of the object is zero or maintained at the same speed for a predetermined time.

10. The method of claim 9, wherein in the operation (b), the first control mode is maintained when the speed of the object is increased in the first control mode to be the predetermined reference speed or less.

11. The method of claim 10, wherein in the operation (b), the first organic light-emitting layer and the second organic light-emitting layer are controlled in a second control mode, in which the first organic light-emitting layer is turned on and the second organic light-emitting layer is turned off, when the speed of the object is increased in the first control mode, and maintained to be greater than the predetermined reference speed for the predetermined time.

12. The method of claim 11, wherein in the operation (b), the amount of the current applied to the first organic light-emitting layer is increased when the first control mode is switched to the second control mode.

13. The method of claim 11, wherein in the operation (b), pre-stored gamma and color coordinate values are applied when the first control mode is switched to the second control mode.

14. The method of claim 8, wherein the object includes a vehicle, and the OLED display is fixed with the vehicle such that the OLED display and the object have the same speed.

* * * * *